US008994369B2

(12) United States Patent
Vig et al.

(10) Patent No.: US 8,994,369 B2
(45) Date of Patent: *Mar. 31, 2015

(54) APPARATUS AND METHOD FOR PROVIDING AN OUTPUT SIGNAL INDICATIVE OF A SPEED OF ROTATION AND A DIRECTION OF ROTATION OF A FERROMAGNETIC OBJECT

(71) Applicant: Allegro Microsystems, LLC, Worcester, MA (US)

(72) Inventors: Ravi Vig, Bow, NH (US); P. Karl Scheller, Bow, NH (US); Paul A. David, Bow, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/093,815

(22) Filed: Dec. 2, 2013

(65) Prior Publication Data

US 2014/0084904 A1 Mar. 27, 2014

Related U.S. Application Data

(63) Continuation of application No. 12/183,367, filed on Jul. 31, 2008, now Pat. No. 8,624,588.

(51) Int. Cl.
| | |
|---|---|
| G01B 7/30 | (2006.01) |
| G01R 33/07 | (2006.01) |
| G01P 3/48 | (2006.01) |
| G01P 3/44 | (2006.01) |
| G01P 3/488 | (2006.01) |
| G01P 3/489 | (2006.01) |
| G01P 13/04 | (2006.01) |

(52) U.S. Cl.
CPC . *G01P 3/44* (2013.01); *G01P 3/488* (2013.01); *G01P 3/489* (2013.01); *G01P 13/045* (2013.01); *G01R 33/07* (2013.01)
USPC ............... 324/207.25; 324/175; 324/251

(58) Field of Classification Search
USPC ........................................... 324/207.25, 251
See application file for complete search history.

(56) References Cited

U.S. PATENT DOCUMENTS

| | | | |
|---|---|---|---|
| 3,304,434 | A | 2/1967 | Koster |
| 4,225,939 | A | 9/1980 | Yashiro |
| 4,283,679 | A | 8/1981 | Ito et al. |
| 4,513,403 | A | 4/1985 | Troy |

(Continued)

FOREIGN PATENT DOCUMENTS

| | | |
|---|---|---|
| DE | 25 18 054 | 11/1976 |
| DE | 40 31 560 | 4/1992 |

(Continued)

OTHER PUBLICATIONS

Notice of Allowance dated Feb. 12, 2004; for U.S. Appl. No. 13/526,106; 25 pages.

(Continued)

*Primary Examiner* — Bot Ledynh
(74) *Attorney, Agent, or Firm* — Daly, Crowley, Mofford & Durkee, LLP

(57) ABSTRACT

An apparatus and a method provide an output signal indicative of a speed of rotation and a direction of rotation of a ferromagnetic object capable of rotating. A variety of signal formats of the output signal are described.

23 Claims, 6 Drawing Sheets

(56) References Cited

U.S. PATENT DOCUMENTS

| | | | |
|---|---|---|---|
| 4,642,555 | A | 2/1987 | Swartz et al. |
| 4,649,796 | A | 3/1987 | Schmidt |
| 4,893,027 | A | 1/1990 | Kammerer et al. |
| 5,244,834 | A | 9/1993 | Suzuki et al. |
| 5,332,956 | A | 7/1994 | Oh |
| 5,486,759 | A | 1/1996 | Seiler et al. |
| 5,696,790 | A | 12/1997 | Graham et al. |
| 5,781,005 | A | 7/1998 | Vig et al. |
| 6,242,604 | B1 | 6/2001 | Hudlicky et al. |
| 6,242,904 | B1 | 6/2001 | Shirai et al. |
| 6,242,905 | B1 | 6/2001 | Draxelmayr |
| 6,242,908 | B1 | 6/2001 | Scheller |
| 6,278,269 | B1 | 8/2001 | Vig et al. |
| 6,297,627 | B1 | 10/2001 | Towne et al. |
| 6,339,322 | B1 | 1/2002 | Loreck et al. |
| 6,492,804 | B2 | 12/2002 | Tsuge et al. |
| 6,525,531 | B2 | 2/2003 | Forrest et al. |
| 6,542,847 | B1 | 4/2003 | Lohberg et al. |
| 6,653,968 | B1 | 11/2003 | Schneider |
| 6,687,644 | B1 | 2/2004 | Zinke et al. |
| 6,815,944 | B2 | 11/2004 | Vig et al. |
| 7,026,808 | B2 | 4/2006 | Vig et al. |
| 7,199,579 | B2 | 4/2007 | Scheller et al. |
| 7,295,000 | B2 | 11/2007 | Werth |
| 7,345,468 | B2 | 3/2008 | Okada et al. |
| 7,362,094 | B2 | 4/2008 | Voisine et al. |
| 7,365,530 | B2 | 4/2008 | Bailey et al. |
| 7,592,801 | B2 | 9/2009 | Bailey et al. |
| 7,800,389 | B2 | 9/2010 | Friedrich et al. |
| 7,923,996 | B2 | 4/2011 | Doogue et al. |
| 8,030,918 | B2 | 10/2011 | Doogue et al. |
| 8,577,634 | B2 | 11/2013 | Donovan et al. |
| 8,624,588 | B2 | 1/2014 | Vig et al. |
| 8,680,846 | B2 | 3/2014 | Cesaretti et al. |
| 2001/0002791 | A1 | 6/2001 | Tsuge et al. |
| 2001/0009367 | A1 | 7/2001 | Seitzer et al. |
| 2002/0027488 | A1 | 3/2002 | Hayat-Dawoodi et al. |
| 2003/0001563 | A1 | 1/2003 | Turner |
| 2004/0062362 | A1 | 4/2004 | Matsuya |
| 2004/0135220 | A1 | 7/2004 | Goto |
| 2005/0120782 | A1 | 6/2005 | Kishibata et al. |
| 2005/0179429 | A1 | 8/2005 | Lohberg |
| 2005/0225318 | A1 | 10/2005 | Bailey et al. |
| 2007/0139036 | A1 | 6/2007 | Kondo |
| 2009/0058404 | A1 | 3/2009 | Kurumado |
| 2009/0251134 | A1 | 10/2009 | Uenoyama |
| 2010/0211347 | A1 | 8/2010 | Friedrich et al. |
| 2011/0018533 | A1 | 1/2011 | Cesaretti et al. |
| 2013/0214774 | A1 | 8/2013 | Cesaretti et al. |
| 2013/0335067 | A1 | 12/2013 | Dwyer et al. |
| 2013/0335068 | A1 | 12/2013 | Dwyer et al. |
| 2013/0335074 | A1 | 12/2013 | Dwyer et al. |

FOREIGN PATENT DOCUMENTS

| | | |
|---|---|---|
| DE | 196 34 715 A1 | 3/1998 |
| DE | 196 50 935 A1 | 6/1998 |
| DE | 198 38 433 | 3/1999 |
| DE | 199 61 504 A1 | 6/2001 |
| EP | 0 944 888 B1 | 10/2001 |
| EP | 1 580 560 A1 | 9/2005 |
| EP | 1 662 353 A1 | 5/2006 |
| JM | 4093381 | 3/2008 |
| JP | 63-300911 | 12/1988 |
| JP | H2-116753 | 5/1990 |
| JP | 02-149013 | 6/1990 |
| JP | H03-29817 | 2/1991 |
| JP | H06-273437 | 9/1994 |
| JP | 07-012582 | 1/1995 |
| JP | 10-332725 | 12/1998 |
| JP | 11-064363 | 3/1999 |
| JP | 2001-043475 | 2/2001 |
| JP | 2001-1695951 | 6/2001 |
| JP | 2002-117500 | 4/2002 |
| JP | 2002-357920 | 12/2002 |
| JP | 4880874 | 12/2011 |
| WO | WO 88/09026 | 11/1988 |
| WO | WO 99/49322 | 9/1999 |
| WO | WO 01/74139 A2 | 10/2001 |
| WO | WO 01/74139 A3 | 10/2001 |
| WO | WO 03/069358 A2 | 8/2003 |
| WO | WO 03/069358 A3 | 8/2003 |
| WO | WO 2005/013363 A2 | 2/2005 |
| WO | WO 2005/013363 A3 | 2/2005 |
| WO | WO 2010/014309 A1 | 2/2010 |

OTHER PUBLICATIONS

U.S. Appl. No. 14/093,787, filed Dec. 2, 2013, Vig et al.
Allegro Microsystems, Inc. Data Sheet A1341; "High Precision, Highly Programmable Linear Hall Effect Sensor IC with EEPROM, Output Protocols SENT and PWM, and Advances Output Linearization Capabilities;" May 17, 2010; 46 pages.
Allegro Microsystems, Inc. Data Sheet ATS601LSG; "Non-TPOS, Tooth Detecting Speed Sensor;" Nov. 1, 2011; 9 pages.
Infineon Technologies; "Differential Two-Wire Hall Effect Sensor IC;" TLE4942 Preliminary Data Sheet; Jun. 2000; pp. 1-13.
Jeffrey et al.; "Sensor Testing Through Bias Superposition;" Science Direct, Sensors and Actuators, A 136; Feb. 6, 2007, pp. 441-455.
Lequesne et al.; "High-Accuracy Magnetic Position Encoder Concept;" IEEE Tranactions on Industry Applications; vol. 35, No. 3; May/Jun. 1999; pp. 568-576.
Robert Bosch GMBH Stuttgart; "Active Sensor for ABS/ASR/VDC-Systems with 2-Wire-Current Interface;" Specification TLE4941/TLE4942; Version 5; Jun. 25, 2000; pp. 1-44s.
Office Action dated May 12, 2011; for U.S. Appl. No. 12/183,367; 17 pages.
Response flied Aug. 9, 2011; to Office Action dated May 12, 2011; for U.S. Appl. No. 12/183,367; 13 pages.
Office Action dated Nov. 20, 2011; for U.S. Appl. No. 12/183,367; 9 pages.
Response filed Jan. 13, 2012; to Office Action dated Nov. 20, 2011; for U.S. Appl. No. 12/183,367; 13 pages.
Office Action/Restriction Requirement dated Apr. 12, 2012; for U.S. Appl. No. 12/183,367; 6 pages.
Response filed Feb. 6, 2013; to Office Action/Restriction Requirement dated Apr. 12, 2012; for U.S. Appl. No. 12/183,367; 4 pages.
Final Office Action dated May 2, 2013; for U.S. Appl. No. 12/183,367; 15 pages.
Response filed Jun. 19, 2013; to Final Office Action dated May 2, 2013; for U.S. Appl. No. 12/183,367; 8 pages.
Final Office Action dated Jul. 1, 2013; for U.S. Appl. No. 12/183,367; 7 pages.
Final Office Action dated Jul. 23, 2013; for U.S. Appl. No. 12/183.367; 8 pages.
Response to Final Office Action filed Aug. 27, 2013; to Office Action dated Jul. 23, 2013; for U.S. Appl. No. 12/183,367; 13 pages.
Notice of Allowance dated Sep. 6, 2013; for U.S. Appl. No. 12/183,367; 7 pages.
EP Office Action dated Mar. 2, 2005 for EP 03 710 766.1.
EP Summons to Oral Proceedings dated Apr. 30, 2009 for EP 03 710 766.1; 4 pages.
EP Communication of Board of Appeals dated May 26, 2009 for EP 03 710 766.1.
EP Reeponse to Office Action submitted May 2009 for EP 03 710 766.1.
JP Official Action dated Apr. 7, 2008 for JP 2003-568426.
JP Response to Official Action dated Sep. 22, 2008 for JP 2003-568426.
JP Official Action dated Dec. 12, 2008 for JP 2003-568425.
JP Response to Official Action dated Mar. 25, 2009 for JP 2003-558426.
JP Office Action dated Nov. 16, 2010 from Application No. 2003-568426.
JP Amendment filed on May 13, 2011 for JP Pat. App. No. 2003-568426; 27 pages.
JP Official Action dated Aug. 29, 2011 for JP Pat. App. No. 2003-568426; 8 pages.

(56) References Cited

OTHER PUBLICATIONS

Letter from Yuasa & Hara dated Aug. 31, 2011; for Japanese Pat. App. No. 2003-568426; 9 pages.
Letter to Yuasa and Hara dated Oct. 4, 2011; for Japanese Pat. App. No. 2003-568426; 1 page.
JP Response to Notice of Rejection; filed Oct. 11, 2011; for JP 2003-568426; 6 pages.
JP Notice of Allowance dated Nov. 8, 2011; for JP 2003-568426; 3 pages.
CN Office Action dated May 3, 2012; for CN Pat. App. No. 200980189766.7; 15 pages.
Letter to NTD Patent and Trademark Agency Limited dated Aug. 29, 2012; Chinese Pat. App. No. 200980129766.7; 20 pages.
Letter from NTD Patent and Trademark Agency Limited dated Feb. 6, 2013; for Chinese Pat. App. No. 200980129766.7; 2 pages.
Letter to NTD Patent and Trademark Agency Limited dated Feb. 6, 2013; for Chinese Pat. App. No. 200980129766.7; 2 pages.
Chinese Office Action dated Jan. 18, 2013; for CN Pat. App. No. 200980129766.7; 8 pages.
Chinese Notice of Allowance; dated Mar. 6, 2013; for Chinese Pat. App. No. 200980189766,7; 4 pages.
EP Response to Written Opinion filed on Apr. 18, 2011 for EP Pat. App. No. 09789890,2; 11 pages.
European Response filed Apr. 18, 2011 to PCT Written Opinion dated Aug. 25, 2009 for EP Patent Appl. No. 09789890.2; 11 pages.
PCT Search Report dated Nov. 19, 2003 for PCT Pat. App. No. PCT/US03/02489 filed on Jan. 29, 2003; 5 pages.
PCT Invitation to Pay Additional Fees dated Oct. 10, 2008 for PCT Pat. App. No. PCT/US03/02489 filed on Jan. 29, 2003; 3 pages.
PCT Search Report and Written Opinion of the ISA for PCT/US2009/048237 dated Aug. 25, 2009.
PCT International Preliminary Report on Patentability for PCT/US2009/048237 dated Feb. 10, 2011.
PCT Search Report and Written Opinion of the ISA; dated Aug. 12, 2013; for PCT Pat. App. No. PCT/US2013/044025; 12 pages.
U.S. Pat. No. 6,815,944; 318 pages.
U.S. Pat. No. 7,026,808; 177 pages.
Office Action dated Sep. 25, 2014 corresponding to U.S. Appl. No. 14/093,787; 14 Pages.
European Office Action dated Oct. 2, 2014; for European Pat. App. No. 09 789 890.2; 5 pages.
PCT International Preliminary Report on Patentability and Written Opinion dated Dec. 31, 2014; for PCT Pat. App. No. PCT/US2013/044025; 10 pages.

APPARATUS AND METHOD FOR PROVIDING AN OUTPUT SIGNAL INDICATIVE OF A SPEED OF ROTATION AND A DIRECTION OF ROTATION OF A FERROMAGNETIC OBJECT

CROSS REFERENCE TO RELATED APPLICATIONS

This application is a Continuation application of and claims the benefit of U.S. patent application Ser. No. 12/183,367 filed Jul. 31, 2008, which is incorporated herein by reference in its entirety.

STATEMENT REGARDING FEDERALLY SPONSORED RESEARCH

Not Applicable.

FIELD OF THE INVENTION

This invention relates generally to integrated circuits and, more particularly, to integrated circuits for detecting and communicating a speed of rotation and direction of rotation of a ferromagnetic object.

BACKGROUND OF THE INVENTION

Proximity detectors for detecting ferromagnetic objects are known. In proximity detectors, the magnetic field associated with the ferromagnetic is detected by a magnetic field-to-voltage transducer (also referred to herein as a magnetic field sensing element), such as a Hall effect element or a magnetoresistance element, which provides a signal (i.e., a magnetic field signal) proportional to a detected magnetic field.

Some proximity detectors merely provide an output signal representative of the proximity of the ferromagnetic object. However, other proximity detectors, i.e., rotation detectors, provide an output signal representative of the approach and retreat of each tooth of a rotating ferromagnetic gear or of each segment of a segmented ring magnet having segments with alternating polarity. The proximity detector (rotation detector) processes the magnetic field signal to generate an output signal that changes state each time the magnetic field signal either reaches a peak (positive or negative peak) or crosses a threshold level. Therefore, the output signal, which has an edge rate or period, is indicative of a rotation and a speed of rotation of the ferromagnetic gear or of the ring magnet.

In one type of proximity detector (rotation detector), sometimes referred to as a peak-to-peak percentage detector (or threshold detector), a threshold level is equal to a percentage of the peak-to-peak magnetic field signal. For this type of proximity detector (rotation detector), the output signal changes state when the magnetic field signal crosses the threshold level. One such peak-to-peak percentage detector is described in U.S. Pat. No. 5,917,320 entitled "Detection of Passing Magnetic Articles While Periodically Adapting Detection Threshold" assigned to the assignee of the present invention and incorporated herein by reference.

In another type of proximity detector (rotation detector), sometimes referred to as a slope-activated detector or as a peak-referenced detector (or peak detector), threshold levels differ from the positive and negative peaks (i.e., the peaks and valleys) of the magnetic field signal by a predetermined amount. Thus, in this type of proximity detector (rotation detector), the output signal changes state when the magnetic field signal departs from a peak and/or valley by the predetermined amount. One such slope-activated detector is described in U.S. Pat. No. 6,091,239 entitled "Detection Of Passing Magnetic Articles With a Peak Referenced Threshold Detector," which is assigned to the assignee of the present invention and incorporated herein by reference. Another such peak-referenced proximity detector is described in U.S. Pat. No. 6,693,419, entitled "Proximity Detector," which is assigned to the assignee of the present invention and incorporated herein by reference. Another such peak-referenced proximity detector is described in U.S. Pat. No. 7,199,579, entitled "Proximity Detector," which is assigned to the assignee of the present invention and incorporated herein by reference.

It should be understood that, because the above-described peak-to-peak percentage detector (threshold detector) and the above-described peak-referenced detector (peak detector) both have circuitry that can identify the positive and negative peaks of a magnetic field signal, the peak-to-peak percentage detector and the peak-referenced detector both include a peak detector circuit adapted to detect a positive peak and a negative peak of the magnetic field signal. Each, however, uses the detected peaks in different ways.

In order to accurately detect the positive and negative peaks of a magnetic field signal, some proximity detectors, i.e., rotation detectors, are capable of tracking at least part of the magnetic field signal. To this end, typically, one or more digital-to-analog converters (DACs) can be used to generate a tracking signal, which tracks the magnetic field signal. For example, in the above-referenced U.S. Pat. Nos. 5,917,320 and 6,091,239, two DACs are used, one (PDAC) to detect the positive peaks of the magnetic field signal and the other (NDAC) to detect the negative peaks of the magnetic field signal.

Some proximity detectors are configured to be able to identify a vibration, for example, either a rotational vibration or a linear vibration of a gear or ring magnet, which vibration can generate signals from a magnetic field sensing element (magnetic field signals) that might appear similar to signals that would be generated during a rotation of the gear or ring magnet in normal operation. Proximity detectors having vibration processors that can detect a vibration are described in U.S. patent application Ser. No. 10/942,577, filed Sep. 16, 2004, entitled "Methods and Apparatus for Vibration Detection," and in U.S. patent application Ser. No. 11/085,648, filed Mar. 21, 2005, entitled "Proximity Detector Having a Sequential Flow State Machine," both of which are assigned to the assignee of the present invention and incorporated herein by reference.

As described above, an output signal generated by a conventional proximity detector used to detect a rotation of a ferromagnetic object (e.g., a ring magnet or a ferromagnetic gear) can have a format indicative of the rotation and of the speed of rotation of the ferromagnetic object or ring magnet. Namely, the conventional proximity detector can generate the output signal as a two-state binary signal having a frequency indicative of the speed of rotation. When the ferromagnetic object is not rotating, the conventional proximity detector can generate an inactive output signal. However the output signal generated by most conventional proximity detectors is not indicative of a direction of rotation of the ferromagnetic object.

SUMMARY OF THE INVENTION

In accordance with one aspect of the present invention, a rotation detector includes a magnetic field sensor for providing an output signal proportional to a magnetic field associated with a ferromagnetic object capable of rotating. The rotation detector also includes one or more detector circuits coupled to receive the output signal from the magnetic field sensor. Each detector circuit is configured to detect a rotation of the ferromagnetic object. The one or more detector circuits are configured to generate a respective one or more output signals, each output signal having respective rising and falling edges. The rotation detector also includes an output protocol circuit coupled to receive the one or more output signals from the one or more detector circuits and configured to generate an output signal indicative of a speed of rotation of the ferromagnetic object and also indicative of a direction of rotation of the ferromagnetic object. The output signal generated by the output protocol circuit comprises at least one of: a first plurality of pulses, each one of the first plurality of pulses having a leading edge with a transition direction indicative of the direction of rotation, or a first number of pulses occurring in instances of the first number of pulses when the ferromagnetic object is rotating in a first direction and a second different number of pulses occurring in instances of the second number of pulses when the ferromagnetic object is rotating in a second different direction.

In accordance with another aspect of the present invention, a method of detecting a rotation of a ferromagnetic object includes generating a first signal proportional to a magnetic field associated with the ferromagnetic object. The method also includes detecting a rotation of the ferromagnetic object in response to the first signal, generating one or more second signals, each having respective rising and falling edges in response to the detecting, and generating a third signal in response to the one or more second signals. The third signal is indicative of a speed of rotation of the ferromagnetic object and is also indicative of a direction of rotation of the ferromagnetic object. The third signal comprises at least one of: a first plurality of pulses, each one of the first plurality of having a leading edge with a transition direction indicative of the direction of rotation, or a first number of pulses occurring in instances of the first number of pulses when the ferromagnetic object is rotating in a first direction and a second different number of pulses occurring in instances of the second number of pulses when the ferromagnetic object is rotating in a second different direction.

With these arrangements, the rotation detector and the method provide an output signal indicative of a speed of rotation and also a direction of rotation of a ferromagnetic object capable of rotating.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "rotation detector" is used to describe a circuit that includes a "magnetic field sensing element," which detects a magnetic field. The rotation detector can sense movement, i.e., rotation, of a ferromagnetic object, for example, advance and retreat of magnetic domains of a ring magnet or advance and retreat of gear teeth of a ferromagnetic gear. The term "proximity detector" is used more broadly herein, to include rotation detectors, and also to include other circuits that merely detect proximity of a magnetic object.

While magnetic field sensing elements are shown and described below to be Hall effect elements, in other arrangements, the magnetic field sensing elements can be, but are not limited to, Hall effect elements, magnetoresistance elements, magnetotransistors, or magnetoinductive devices. As is known, there are different types of Hall effect elements, for example, a planar Hall element, and a vertical Hall element. As is also known, there are different types of magnetoresistance elements, for example, a giant magnetoresistance (GMR) element, an anisotropic magnetoresistance element (AMR), a tunneling magnetoresistance (TMR) element, and a magnetic tunnel junction (MTJ).

Figure 1:
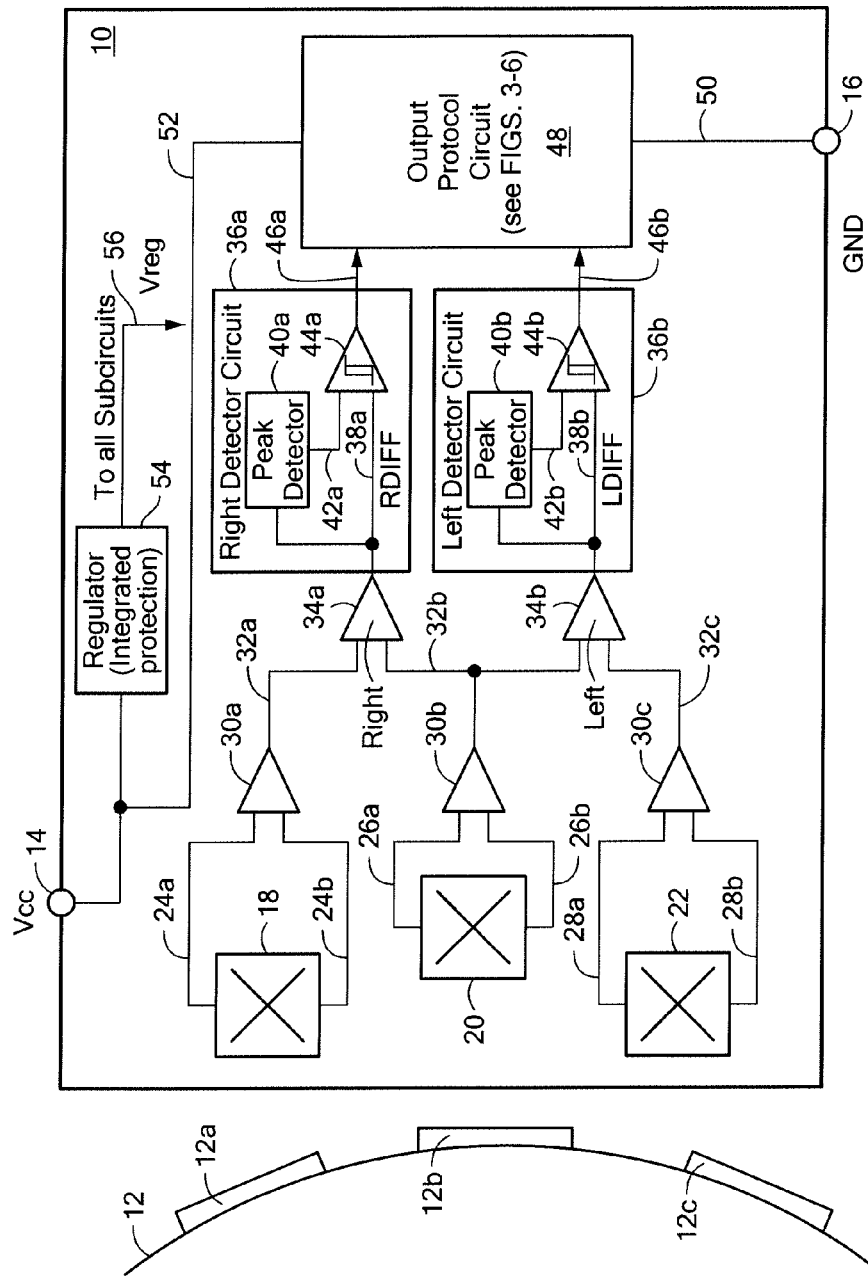
FIG. 1 is a block diagram showing a rotation detector proximate to a ferromagnetic object, the rotation detector having an output protocol circuit configured to generate an output signal indicative of a speed of rotation and also a direction of rotation of the ferromagnetic object.

Referring to FIG. 1, an exemplary rotation detector 10 can be used, for example, to detect passing gear teeth, for example, gear teeth 12a-12c of a ferromagnetic gear 12. One of ordinary skill in the art will understand that a permanent magnet (not shown) can be placed at a variety of positions proximate to the gear 12, resulting in fluctuations of a magnetic field proximate to the gear 12 as the gear 12 having the gear teeth 12a-12c rotates.

The rotation detector 10 can have a first port 14 coupled to a power supply denoted as Vcc. The rotation detector 10 can also have a second port 16 coupled to a fixed voltage source, for example, a ground voltage source, denoted as GND. Thus, is some arrangements, the rotation detector 10 is a two port device, for which an output signal appears as a signal current at the first port 14, superimposed upon the power supply voltage, Vcc. However, in other arrangements, one of ordinary skill in the art will understand that a rotation detector similar to the rotation detector 10 can have a third port (not shown) at which an output signal can appear as a voltage rather than a current.

The rotation detector 10 can include first, second, and third magnetic field sensing elements 18, 20, 22, respectively, here shown to be Hall effect elements. The first Hall effect element 18 generates a first differential voltage signal 24a, 24b, the second Hall effect element 20 generates a second differential voltage signal 26a, 26b, and the third Hall effect element 22 generates a third differential voltage signal 28a, 28b, each having an AC signal component in response to the rotating gear 12.

While each one of the Hall effect elements 18, 20, 22 is shown to be a two port device, one of ordinary skill in the art will understand that each one of the Hall effect elements 18, 20, 22 is actually a four port device and the other two ports of the Hall effect elements can be coupled to receive and pass respective currents as might be provided, for example, by respective current sources or a voltage source (not shown).

The first differential voltage signal 24a, 24b is received by a first differential preamplifier 30a, the second differential voltage signal 26a, 26b is received by a second differential preamplifier 30b, and the third differential voltage signal 28a, 28b is received by a third differential preamplifier 30c.

First and second output signals 32a, 32b generated by the first and second differential preamplifiers 30a, 30b, respectively, are received by a "right" channel amplifier 34a and the second output signal 32b and a third output signals 32c generated by the second and third differential preamplifiers 30b, 30c, respectively, are received by a "left" channel amplifier 34b. Designations of "right" and "left" are arbitrary but are generally indicative of rotation of the gear 12 in first and second directions.

A signal 38a generated by the right channel amplifier 34a is received by a right channel detector circuit 36a and a signal 38b generated by the left channel amplifier 34b is received by a left channel detector circuit 36b. The signals 38a, 38b can be analog signals, generally sinusoidal in nature.

Taking the right channel detector circuit 36a as representative of both of the detector circuits 36a, 36b, the right channel detector circuit 36a includes a peak detector circuit 40a coupled to receive the signal 38a. The peak detector circuit 40a is configured to detect positive and negative peaks of the signal 38a and to generate the threshold signal 42a that, for example, takes on a first static threshold value just below a positive peak of the signal 38a or a second static threshold value just above a negative peak of the signal 38a, depending upon a direction of transition of the signal 38a. A comparator 44a is coupled to receive the threshold signal 42a and is also coupled to receive the signal 38a. As a result, the comparator 44a generates a binary signal 46a that has transitions when the signal 38a crosses both the first and second static thresholds, near to a time when the signal 38a achieves positive and negative peaks.

A signal 46b generated by the left channel detector circuit 36b is generated in the same way as the signal 46a. However, since the magnetic field sensing elements 18, 20 contribute to the signal 46a, while the magnetic field sensing elements 20, 22 contribute to the signal 46b, it should be appreciated that the signals 46a, 46b have edges that differ in time (which is equivalent to phase for a particular signal frequency, i.e., particular rotation speed). Furthermore, it should be appreciated that a direction of rotation of the gear 12 may be determined from a relative phase or relative time difference (e.g., lag or lead) of a particular edge transition in the signal 46a compared with a particular corresponding edge transition in the signal 46b. Therefore, a relative lag or a lead of edges of the signals 46a, 46b can be used to identify a direction of rotation of the gear 12.

The rotation detector 10 can include an output protocol circuit 48 coupled to receive and process the signals 46a, 46b and configured to generate an output signal 52 as a current signal, which is indicative of the speed of rotation and the direction of rotation of the gear 12.

While the rotation detector 10 is shown to include the detector circuits 36a, 36b, each having a particular topology, it should be understood that any form of peak-referenced detectors or peak-to-peak percentage detectors, including, but not limited to, the above-described peak-referenced detectors and peak-to-peak percentage detectors, can be used in place of or in addition to the detector circuits 36a, 36b.

Figure 2:
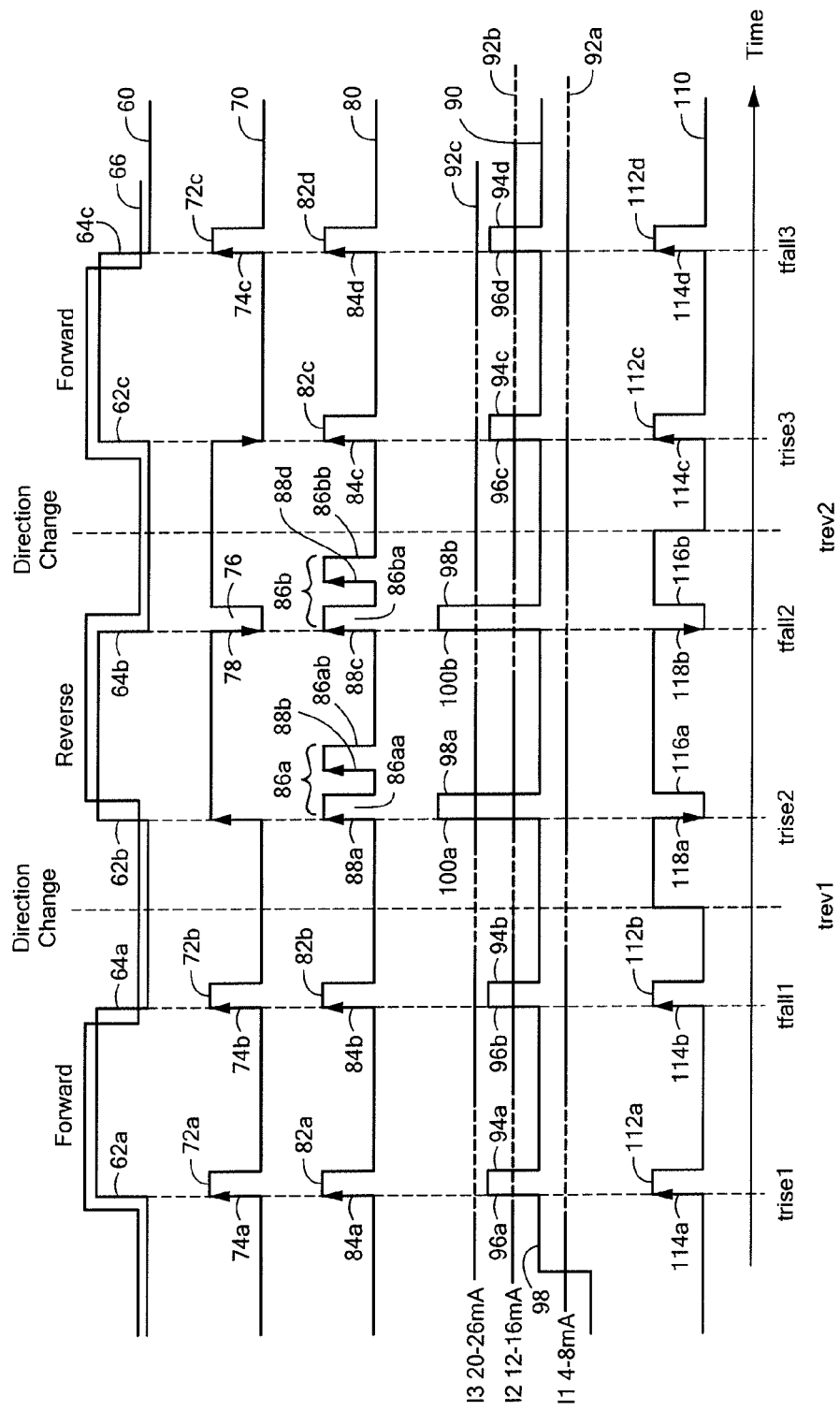
FIG. 2 has several graphs, each graph representative of a different exemplary output signal that can be generated by the output protocol circuit of FIG. 1 in order to be indicative of the speed of rotation and also the direction of rotation of the ferromagnetic object.

Referring now to FIG. 2, a graph has a horizontal axis in units of time in arbitrary units. A curve 60 is representative of one of the signals 46a, 46b received by the output protocol circuit 48. The curve 60 represents a binary (two-state) signal, having positive transitions 62a-62c at times trise1, trise2, and trise3, respectively, and negative transitions 64a-64c at times tfall1, tfall2, and tfall3, respectively, when the gear 12 is rotating at a rotational speed proportional to a frequency of the signal 60.

The signal 60 encounters reversals of direction of rotation of the gear 12 at times trev1 and trev2. Prior to the time trev1, the gear 12 is rotating in a first direction. Between times trev1 and trev2, the gear 12 is rotating in a second different direction. After the time trev2, the gear is again rotating in the first direction.

A curve 66, representative of the other one of the signals 46a, 46b of FIG. 1, has generally the same shape and transitions as the signal 60 but has a phase either leading or lagging the phase of the signal 60 according to the direction of rotation of the gear 12 of FIG. 1. Thus, transitions of the signal 66 lead the signal 60 prior to the time trev1, transitions of the signal 66 lag the signal 60 between the times trev1 and trev2, and transitions of the signal 66 again lead transitions of the signal 60 after the time trev2. The curve 66 is shown with a small vertical offset from the signal 60 for clarity.

A curve 70 is representative of the output signal 52 generated by a first embodiment of the output protocol circuit 48 of FIG. 1, which embodiment is further described below in conjunction with FIG. 3. The output signal 70 has pulses 72a-72c and 76. The pulses 72a-72c have rising leading edges 74a-74c. The pulse 76 has a falling leading edge 78. It will be understood that the output signal 70 has a plurality of pulses, each one of the plurality of pulses having a leading edge with a transition direction indicative of the direction of rotation. Thus, between times trev1 and trev2, the leading edge of the pulse 76 is a falling leading edge and at other times, the leading edges of the pulses 72a-72c are rising leading edges. However, pulses with the opposite leading edge directions are also possible.

As used herein, the term "pulse" is used to describe a portion of a binary signal, wherein a width of the pulse is less than about fifty percent of a period of the binary signal. Therefore, it will be understood that a pulse is a brief excursion of a signal from one signal value to another signal value.

At a time trise2, during a time period between times trev1 and trev2 when the direction has changed to reverse, the pulse width of the high state changes from the width of the pulses 72a, 72b to be longer, having a length depending on speed of rotation. As a result, the output protocol circuit 48 of FIG. 1 can identify that the direction of rotation has changed. The rising edge at the time trise2 still conveys the edge information, but the expected high state time duration changed because the direction changed. Also, at time trise3, the falling edge of the signal 70 conveys the edge position, but the expected low state time duration changed, indicating that the direction of rotation changed again.

In the signal 70, the pulses are inverted in the reverse direction of rotation. For example, if the pulses, e.g., 72a, 72b, have forty-five millisecond high states (pulse widths) when the direction of rotation is forward, when the direction of rotation is in reverse, the pulses, e.g., the pulse 78, have forty-five millisecond low states (pulse widths). As speed varies in the forward direction, the high state of the pulses (pulse width) remains forty-five milliseconds, and as speed varies in the reverse direction, the low state (pulse width) of the pulses remains forty-five milliseconds.

A curve 80 is representative of the output signal 52 generated by a second embodiment of the output protocol circuit 48 of FIG. 1, which embodiment is further described below in conjunction with FIG. 4. The output signal 80 has pulses 82a-82d, each of which is referred to herein as an "instance" having one pulse. The output signal 80 also has pulses 86aa, 86ab, 86ba, 86bb, which appear in double pulse groups 86a, 86b, and each double pulse group 86a, 86b is referred to here as an instance having two pulses. All of the pulses 82a-82d, 86aa, 86ab, 86ba, 86bb have rising leading edges 84a-84d, 88a-88d, respectively. It will be understood that the output signal 80 has a first number of pulses (i.e. one pulse, e.g., the pulse 82a) occurring in instances (e.g., 82a, 82b) of the first number of pulses when the ferromagnetic object (e.g., gear 12 of FIG. 1) is rotating in a first direction, and a second different number of pulses (i.e., two pulses, e.g., the pulses 86aa, 86ab) occurring in instances (e.g., 86a, 86b) of the second number of pulses when the ferromagnetic object (e.g., gear 12 of FIG. 1) is rotating in a second different direction.

While one pulse (e.g., 82a) is shown to be representative of a first direction of rotation, and two pulses (e.g., 86aa, 86ab) are shown to be representative of a second different direction of rotation, other numbers of pulses can also be used, so long as there are different numbers of pulses representative of each respective direction of rotation.

Also, while the single pulses (e.g., 82a) and the multiple pulses (e.g., 86aa, 86ab) are shown to have leading edge transitions in the same positive direction, in other arrangements, the leading edge transitions of the single pulses 82a-82d can be in a direction opposite from the leading edge transitions of the multiple pulses 88aa-88ab and 86ba-8bb.

A curve 90 is representative of the output signal 52 generated by a third embodiment of the output protocol circuit 48 of FIG. 1, which embodiment is further described below in conjunction with FIG. 5. The curve 90 is shown in conjunction with a vertical amplitude scale of signal currents represented by lines 92a, 92b, 92c. The line 92a is indicative of a signal current of about four to eight milliamps, the line 92b is indicative of a signal current of about twelve to sixteen milliamps, and the line 92c is indicative of a signal current of about twenty to twenty-six milliamps. It should be appreciated that the indicated current ranges are illustrative only and that other current ranges can be used.

The output signal 90 has pulses 94a-94d with a first amplitude between currents represented by the lines 92b and 92c. The output signal 90 also has pulses 98a, 98b with a second different amplitude above a current represented by the line 92c. All of the pulses 94a-94d, 98a, 98b have rising leading edges 96a-96d, 100a, 100b, respectively. In some embodiments, at times when pulses are not present, for example, at a baseline signal level 98, the signal 90 can take on a third different amplitude above a current represented by the line 92a, but below a current represented by the line 92b.

It will be understood that the output signal 90 has a plurality of pulses 94a-94d, 98a, 98b, each one of the plurality of pulses having a respective pulse amplitude selected from among a first pulse amplitude (e.g., the pulse 94a) and a second different pulse amplitude (e.g., the pulse 98a), wherein the first and second pulse amplitudes are indicative of respective directions of rotation of the ferromagnetic object (e.g., gear 12 of FIG. 1).

A curve 110 is representative of the output signal 52 generated by a fourth embodiment of the output protocol circuit 48 of FIG. 1, which embodiment is further described below in conjunction with FIG. 6. The output signal 110 has pulses 112a-112d and 116a-116b. The pulses 112a-112d have rising leading edges 114a-114d, respectively. The pulses 116a-116b have falling leading edges 118a-118b, respectively. It will be understood that the output signal 110, like the signal 70, has a plurality of pulses, each one of the plurality of pulses having a leading edge with a transition direction indicative of the direction of rotation. Thus, between times trev1 and trev2, the leading edges of the pulses 116a-116b are falling leading edges and at other times, the leading edges of the pulses 112a-112d are rising leading edges. However, pulses with the opposite leading edge directions are also possible.

While pulses having particular directions of leading edge transitions are shown, in other arrangements, the signals 70, 80, 90, 110 can be inverted, resulting in leading edge transitions in the opposite directions from those shown.

In some arrangement the pulses 72a-72c, and 76, the pulses 82a-82d and 86aa-88ab and 86ba-86bb, the pulses 94a-94d and 98a-98b, and the pulses 112a-112c and 118a-118b have time durations (pulse widths) of about forty-five milliseconds. However, it will be apparent that the pulse widths of the various pulses can be predetermined in accordance with a frequency at which the pulses (or instances of groups of pulses in the signal 90) occur.

The frequency at which the pulses or instances occur can be indicative of a rotational speed of the rotating ferromagnetic object (e.g., the gear 12 of FIG. 1). The frequency at which the pulses or instances occur is shown to be the same as the frequency of the signals 60 and 66 in FIG. 2, which signals are representative of output signals 46a, 46b from the detector circuits 36a, 36b of FIG. 1, and which signals are representative of the rotational speed of the ferromagnetic object. However, in other arrangements, the frequency at which the pulses or instances occur is not the same as the frequency of the output signal of the detector circuits. Nevertheless, the frequency at which the pulses or instances occur can still be indicative of the rotational speed of the rotating ferromagnetic object 12.

While the signals 70, 80, 90, and 110 are representative of current signals, e.g., the current signal 52 of FIG. 1 appearing at the node 14, in other arrangements, the signals 70, 80, 90, and 110 are voltage signals appearing at another port (not shown) of the rotation detector 10 of FIG. 1.

While positive and negative pulses having pulse widths of forty-five milliseconds are described above, in other embodiments, the pulse widths can be within a range of about five to five hundred milliseconds.

It should be apparent that the low states of the signals 70, 80, 110 need not be representative of zero current or zero volts. Instead, in some embodiments, any of the signals 70, 80, 110 can have respective low states that are at a positive voltage or current. However, in some other embodiments, any of the signals 70, 80, 110 can have respective low states that are at a negative voltage or current.

FIGS. 3-6 are block diagram showing exemplary circuits that can form the output protocol circuit 48 of FIG. 1. The circuits of FIGS. 3-6 can be used to generate the output signals 70, 80, 90, and 110 of FIG. 2, respectively.

Figure 3:
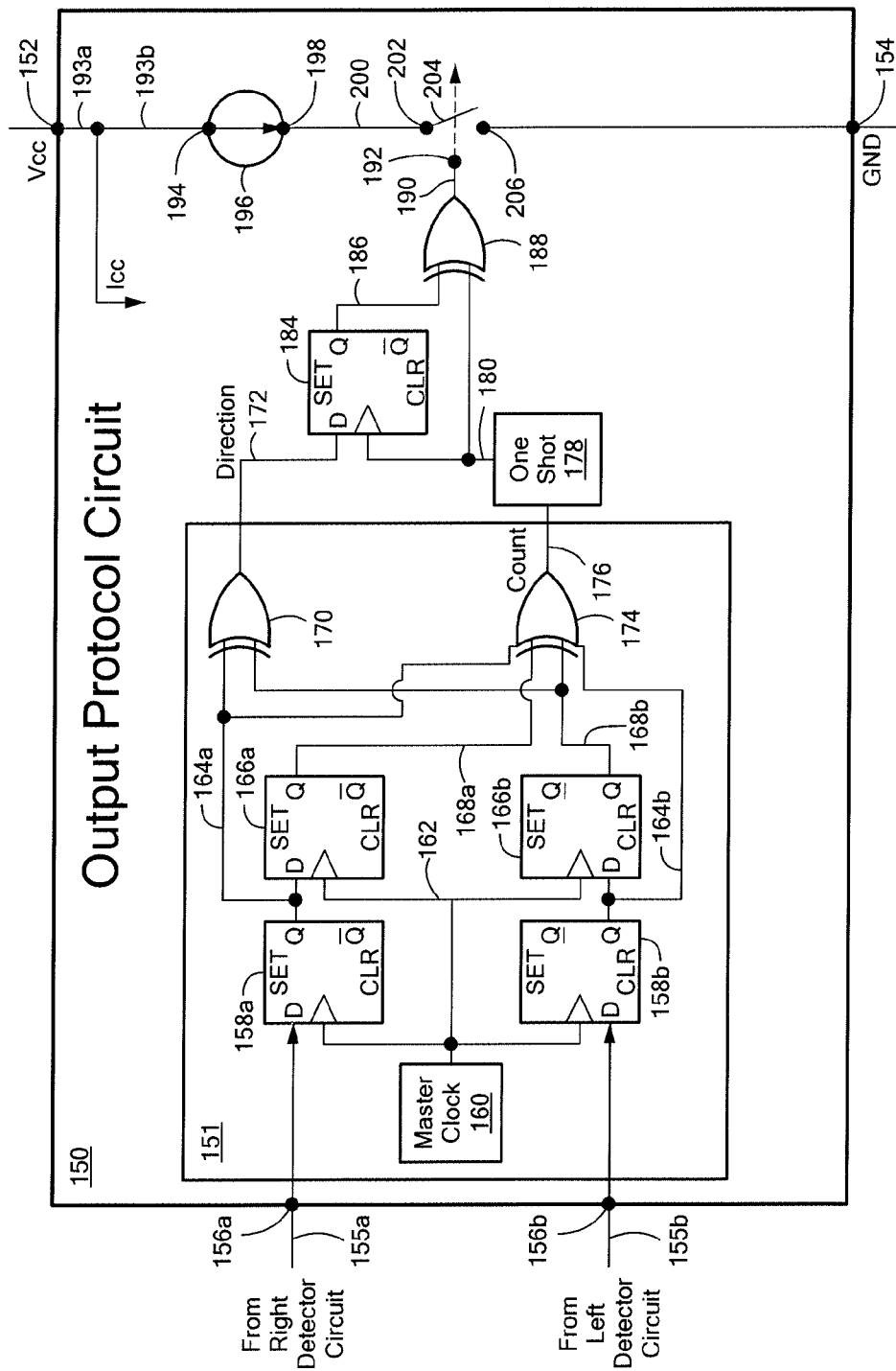
FIG. 3 is a block diagram of an exemplary output protocol circuit that can be used as the output protocol circuit of FIG. 1 in order to generate one of the output signals shown in FIG. 2.

Referring now to FIG. 3, an exemplary output protocol circuit 150 has a power supply/signal port 152 coupled to receive a power supply voltage signal denoted Vcc. At the port 152, and as further described below, the output protocol circuit 150 can also generate an output signal in the form of a current signal 193a superimposed upon the power supply voltage signal Vcc. It will become apparent from discussion below that the output protocol circuit 150 is configured to generate the current output signal 193a at the node 152 that is the same as or similar to the signal 70 of FIG. 2. The output protocol circuit 150 also has a reference port 154, which can be coupled to a reference voltage, for example, ground.

The output protocol circuit 150 also has two input ports 156a, 156b coupled to receive a respective two input signals 155a, 155b from a respective two detector circuits, for example, from the detector circuits 36a, 36b of FIG. 1, wherein the two input signals 155a, 155b can be the same as or similar to the signals 46a, 46b, respectively. As described above, the signals 46a, 46b generated by the detector circuits 36a, 36b are binary two-state signals. The signals 46a, 46b can be digital signals having high and low state values that can be operated upon by convention digital circuits, for example, CMOS digital circuits.

The first and second input signals 155a, 155b are received at respective D inputs of first and second D-type flip-flops 158a, 158b, which are clocked by a common master clock signal 162 generated by a master clock circuit 160. In some embodiments, the master clock signal 162 is synchronous with the input signals 155a, 155b. Furthermore, the master clock signal 162 has clocking transitions occurring after transitions of one of the input signals 155a or 155b and before corresponding transitions of the other one of the input signals 155a or 155b. For example, referring briefly to FIG. 2, the clocking transitions of the master clock signal 162 can occur after the rising transitions of the signal 66 and before corresponding rising transitions of the signal 60.

Outputs signal 164a, 164b generated by the first and second D-type flip-flops 158a, 158b are received by D inputs of third and fourth D-type flip-flops 166a, 166b, respectively. An exclusive OR gate 170 is coupled to receive the output signal 164a from the first flip-flop 158a and to receive the output signal 168b from the fourth flip-flop 166b. In response, the exclusive OR gate 170 generates an output signal 172 having a state representative of a direction of rotation of a ferromagnetic object, for example, of the ferromagnetic gear 12 of FIG. 1. The state of the signal 172 is static for any one static direction of rotation. Thus, the signal 172 is also referred to herein as a "direction signal."

Another exclusive OR gate 174 is coupled to receive the output signals 164a, 164b, 168a, 168b from the first, second, third, and fourth flip-flops 158a, 158b, 166a, 166b, respectively. In response, the exclusive OR gate 174 generates an output signal 176 having pulses generally at times of each transition of the input signals 155a, 155b. Thus, the signal 176 is also referred to herein as a "count signal."

The count signal 176 is received by a one-shot circuit 178 (monostable multivibrator), that generates a pulse signal 180 having pulses, each having a predetermined pulse width, upon each transition of the signal 176 having a predetermined direction of transition. For example, in one particular embodiment, the pulses within the pulse signal 180 are generated by the one-shot circuit 178 upon each rising edge of the count signal 176.

The pulse signal 180 provides a clocking signal to a fifth D-type flip-flop 184. The direction signal 172 is received at the D input of the D-type flip-flop 184. Another exclusive OR gate 188 is coupled to receive an output signal 186 from the D-type flip-flop 184 and to receive the pulse signal 180. In operation, an output signal 190 generated by the exclusive OR gate 188, which is a voltage signal, appears similar to the signal 70 of FIG. 2, which is described above to be a current signal.

The voltage signal 190 is converted to a current signal 193b by a switch 204 in combination with a current source 196. The switch 204 has an input node 202, a control node 192, and an output node 204. The current source 196 has an input node 194 coupled to the node 152 and an output node 198 coupled to the input node 202 of the switch 204. A current signal 200 (and 193b) having a positive current value passes from the output node 198 of the current source 196 to the input node 202 of the switch 204 only when the switch 204 is closed, otherwise the current signal 200 (and 193b) has a current value of zero. The switch 204 is coupled to receive the voltage signal 190 at the control node 192, and therefore, the switch 204 is configured to open and close in accordance with states of the signal 190.

In operation, when the direction signal 172 is in a low state indicative of a first direction of rotation, pulses in the pulse signal 180 pass through the exclusive OR gate 188 and appear in the signals 190, 193a, and 193b. Alternatively, when the direction signal 172 is in a high state indicative of a second different direction of rotation, pulses in the pulse signal 180 are inverted by the exclusive OR gate 188 and appear inverted in the signals 190, 193a, and 193b. Therefore, the current signals 193a, 193b are the same as or similar to the signal 70 of FIG. 2.

It will be apparent that the current signal 193a can include an Icc current component as shown, which can result in the current signal 193a being offset from the current signal 193b. The Icc current component can be a current signal corresponding to a DC current used to power other portions of the circuit 150. However, in other embodiments, the current signal 193a can be further offset in a positive or in a negative direction by use of a current source or current sink in parallel with the Icc current signal.

Figure 4:
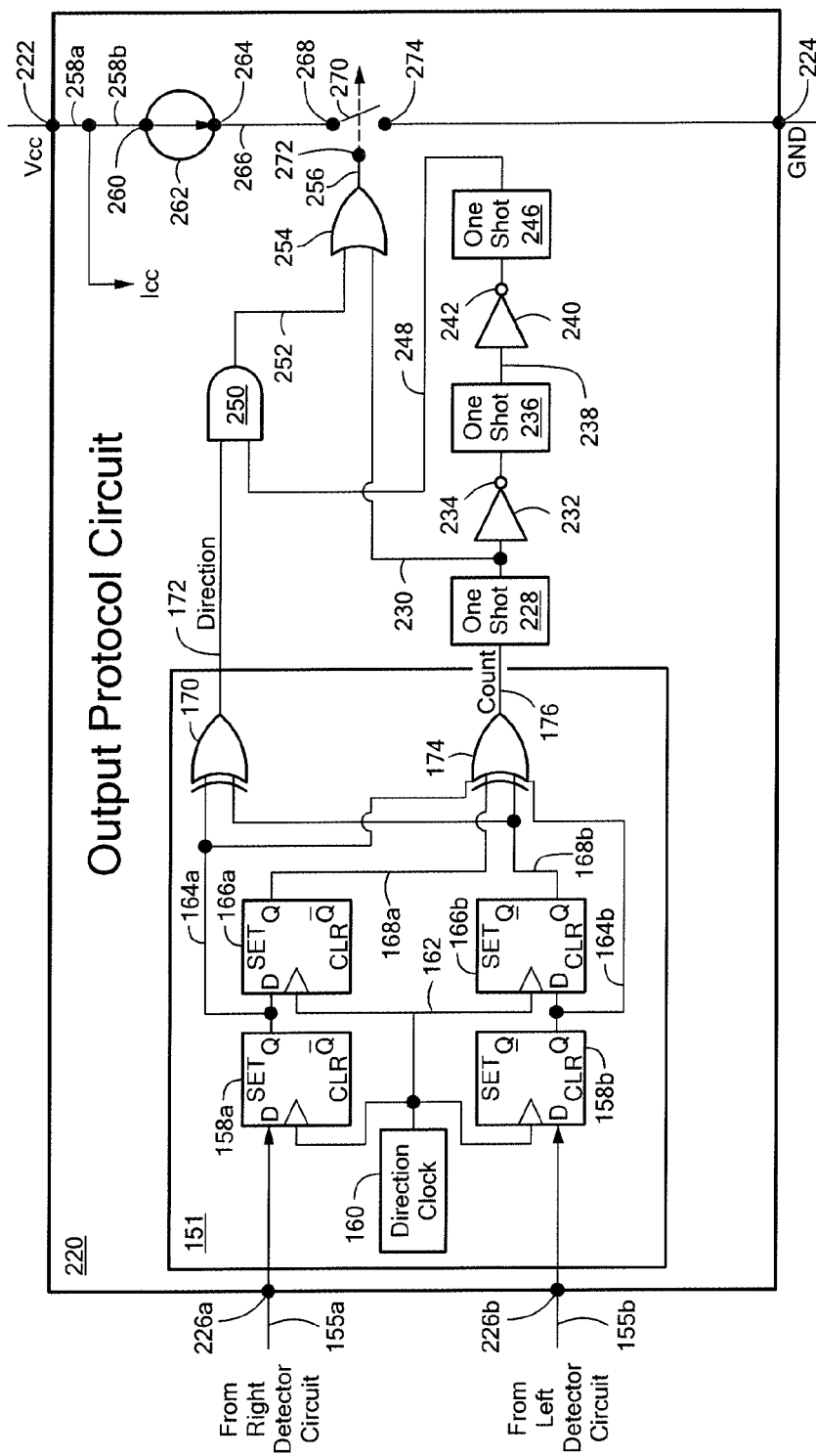
FIG. 4 is a block diagram of another exemplary output protocol circuit that can be used as the output protocol circuit of FIG. 1 in order to generate another one of the output signals shown in FIG. 2.

Referring now to FIG. 4, another exemplary output protocol circuit 220 has a power supply/signal port 222 coupled to receive a power supply voltage signal denoted Vcc. At the port 222, and as further described below, the output protocol circuit 220 can also generate an output signal in the form of a current signal 258a superimposed upon the power supply voltage signal Vcc. It will become apparent from discussion below that the output protocol circuit 220 is configured to generate the current output signal 258a at the node 222 that is the same as or similar to the signal 80 of FIG. 2. The output protocol circuit 220 also has a reference port 224, which can be coupled to a reference voltage, for example, ground.

The output protocol circuit 220 also has two input ports 226a, 226b coupled to receive the respective two input signals 155a, 155b from a respective two detector circuits, for example, from the detector circuits 36a, 36b of FIG. 1. The first and second input signals 155a, 155b are received by the circuit 151, which is described more fully above in conjunction with FIG. 3, resulting in the direction signal 172 and in the count signal 176. The count signal 176 is received by a first one-shot circuit 228 configured to generate a first pulse signal 230. The first pulse signal 230 is received by a first inverter 232 configured to generate an inverted first pulse signal 234. The inverted first pulse 234 is received by a second one-shot circuit 236 configured to generate a second pulse signal 238. The second pulse signal 238 is received by a second inverter 240 configured to generate an inverted second pulse signal 242. The inverted second pulse signal 242 is received by a third one-shot circuit configured to generate a third pulse signal 248.

The third pulse signal 248 and the direction signal 172 are received by an AND gate 250 configured to generate a signal 252. The signal 252 and the first pulse signal 230 are received by an OR gate 254 configured to generate an output signal 256. The output signal 256 generated by the OR gate 254, which is a voltage signal, appears similar to the signal 80 of FIG. 2, which is described above to be a current signal.

The voltage signal 256 is converted to a current signal 258b by a switch 270 in combination with a current source 262. The switch 270 has an input node 268, a control node 272, and an output node 274. The current source 262 has an input node 260 coupled to the node 222 and an output node 264 coupled to the input node 268 of the switch 270. A current signal 266 (and 258b) having a positive current value passes from the output node 264 of the current source 262 to the input node 268 of the switch 270 only when the switch 270 is closed, otherwise the current signal 266 (and 258b) has a current value of zero. The switch 270 is coupled to receive the voltage signal 256 at the control node 272, and therefore, the switch 270 is configured to open and close in accordance with states of the signal 256.

In operation, when the direction signal 172 is in a low state indicative of a first direction of rotation, only pulses in the first pulse signal 230 pass through the OR gate 254 and appear in the signals 256, 258a, and 258b. Alternatively, when the direction signal 172 is in a high state indicative of a second different direction of rotation, pulses in the first pulse signal 230 and also pulses in the third pulse signal 248 (i.e., two pulses) pass through the OR gate 254 and appear in the signals 256, 258a, and 258. Therefore, the current signals 258a, 258b are the same as or similar to the signal 80 of FIG. 2.

It will be apparent that the current signal 258a can include an Icc current component as shown, which can result in the current signal 258a being offset from the current signal 258b. The Icc current component can be a current signal corresponding to a DC current used to power other portions of the circuit 220. However, in other embodiments, the current signal 258a can be further offset in a positive or in a negative direction by use of a current source or current sink in parallel with the Icc current signal.

Figure 5:
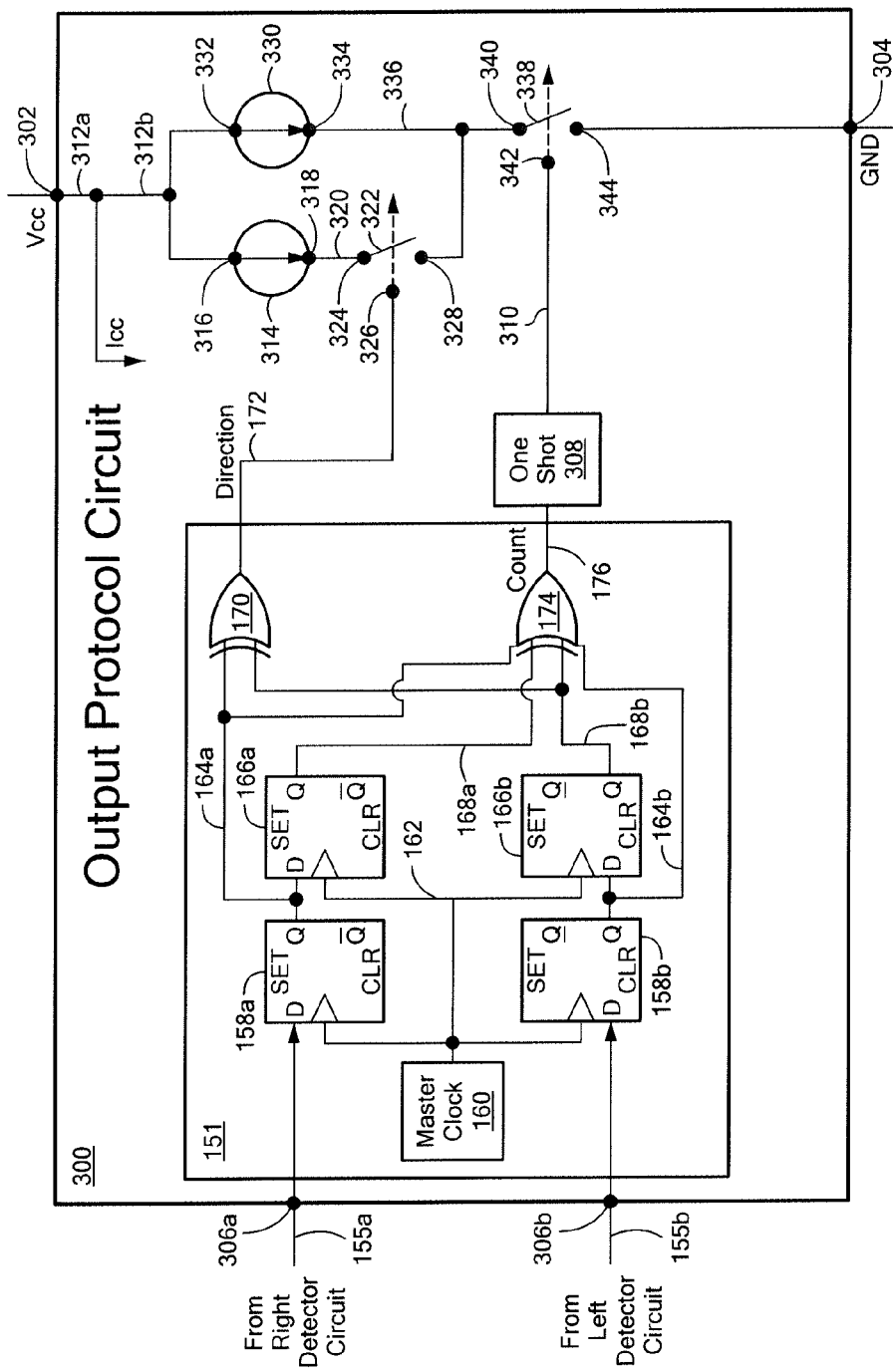
FIG. 5 is a block diagram of another exemplary output protocol circuit that can be used as the output protocol circuit of FIG. 1 in order to generate another one of the output signals shown in FIG. 2.

Referring now to FIG. 5, another exemplary output protocol circuit 300 has a power supply/signal port 302 coupled to receive a power supply voltage signal denoted Vcc. At the port 302, and as further described below, the output protocol circuit 300 can also generate an output signal in the form of a current signal 312a superimposed upon the power supply voltage signal Vcc. It will become apparent from discussion below that the output protocol circuit 300 is configured to generate the current output signal 312a at the node 302 that is the same as or similar to the signal 90 of FIG. 2. The output protocol circuit 300 also has a reference port 304, which can be coupled to a reference voltage, for example, ground.

The output protocol circuit 300 also has two input ports 306a, 306b coupled to receive the respective two input signals 155a, 155b from a respective two detector circuits, for example, from the detector circuits 36a, 36b of FIG. 1. The first and second input signals 155a, 155b are received by the circuit 151, which is described more fully above in conjunction with FIG. 3, resulting in the direction signal 172 and in the count signal 176. The count signal 176 is received by a one-shot circuit 308 configured to generate a pulse signal 310.

A current signal 312b is generated by switches 322, 338 in combination with current sources 314, 330. The switch 322 has an input node 324, a control node 326, and an output node 328. The switch 338 has an input node 340, a control node 342, and an output node 344. The current source 314 has an input node 316 coupled to the node 302 and an output node 318 coupled to the input node 324 of the switch 322. The current source 330 has an input node 332 coupled to the node 302 and an output node 334 coupled to the input node 340 of the switch 338. The output node 328 of the switch 322 is also coupled to the input node 340 of the switch 338.

A current signal 320 having a positive current value passes from the output node 318 of the current source 314 to the input node 324 of the switch 322 only when the switch 322 is closed, otherwise the current signal 320 has a current value of zero. The switch 322 is coupled to receive the direction signal 172 at the control node 326, and therefore, the switch 322 is configured to open and close in accordance with states of the direction signal 172.

A current signal 336 having a positive current value passes from the output node 334 of the current source 330 to the input node 340 of the switch 338 only when the switch 338 is closed, otherwise the current signal 336 has a current value of zero. The switch 338 is coupled to receive the pulse signal 310 at the control node 342, and therefore, the switch 338 is configured to open and close in accordance with states of the pulse signal 310.

The current signals 320, 330 combine at the input node 340 of the switch 338 when the switch 322 is closed, but only the current signal 336 appears at the input node 340 of the switch 338 when the switch 322 is open. In this way, two current levels are achieved.

In operation, when the direction signal 172 is in a low state indicative of a first direction of rotation, only the current signal 336 is in the current signal 312b. Alternatively, when the direction signal 172 is in a high state indicative of a second different direction of rotation, the current signals 320 and 336 combine in the current signal 312b. Therefore, the current signals, 312a, 312b are the same as or similar to the signal 90 of FIG. 2.

It will be apparent that the current signal 312a can include an Icc current component as shown, which can result in the current signal 312a being offset from the current signal 312b. The Icc current component can be a current signal corresponding to a DC current used to power other portions of the circuit 300. However, in other embodiments, the current signal 312a can be further offset in a positive or in a negative direction by use of another current source or current sink in parallel with the Icc current signal. The Icc current (when both switches 322, 338 are open) can correspond to the baseline signal level 98 of FIG. 2.

Figure 6:
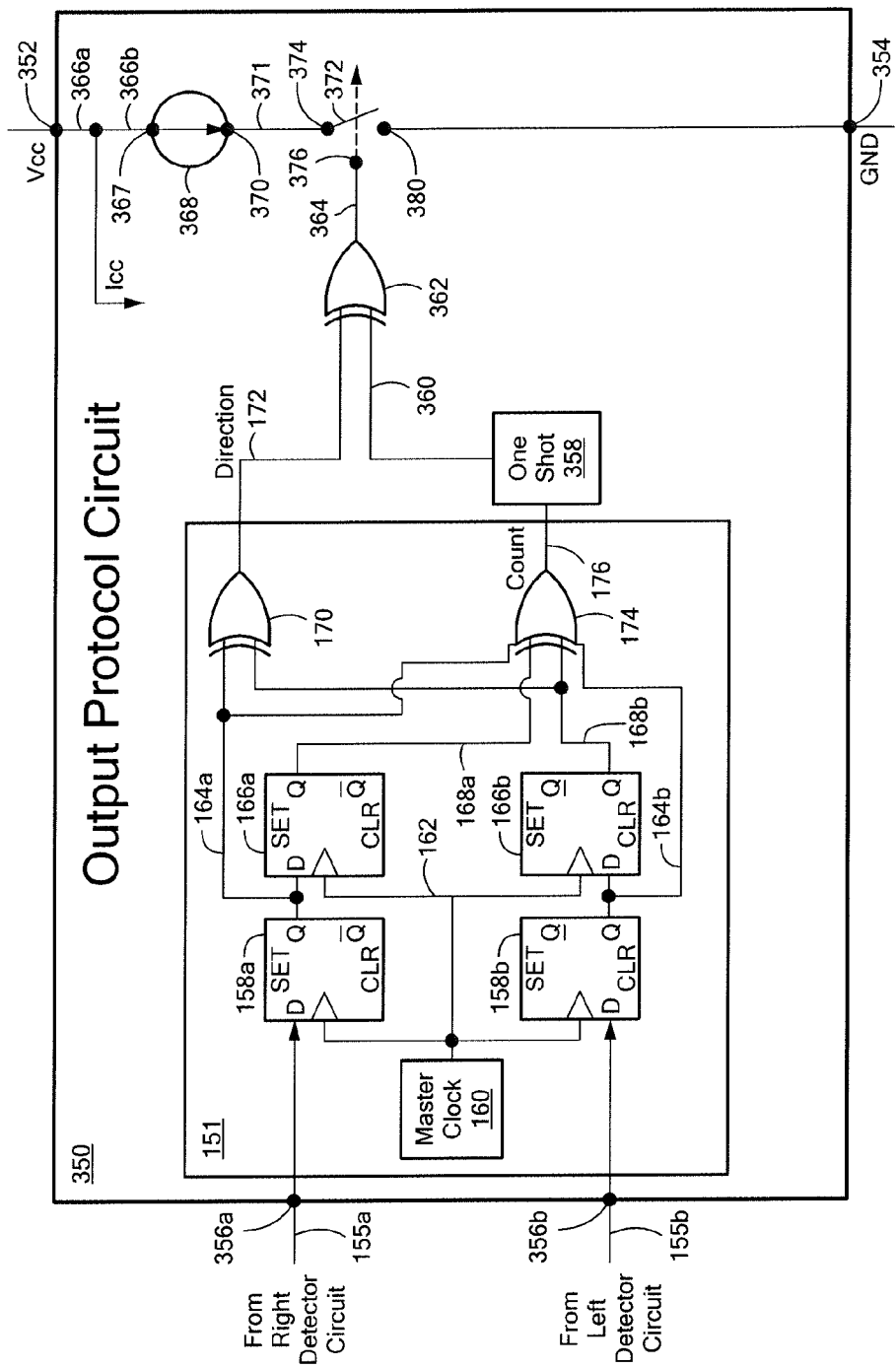
FIG. 6 is a block diagram of another exemplary output protocol circuit that can be used as the output protocol circuit of FIG. 1 in order to generate another one of the output signals shown in FIG. 2.

Referring now to FIG. 6, another exemplary output protocol circuit 350 has a power supply/signal port 352 coupled to receive a power supply voltage signal denoted Vcc. At the port 352, and as further described below, the output protocol circuit 350 can also generate an output signal in the form of a current signal 366a superimposed upon the power supply voltage signal Vcc. It will become apparent from discussion below that the output protocol circuit 350 is configured to generate the current output signal 366a at the node 352 that is the same as or similar to the signal 110 of FIG. 2. The output protocol circuit 350 also has a reference port 354, which can be coupled to a reference voltage, for example, ground.

The output protocol circuit 350 also has two input ports 356a, 356b coupled to receive the respective two input signals 155a, 155b from a respective two detector circuits, for example, from the detector circuits 36a, 36b of FIG. 1. The first and second input signals 155a, 155b are received by the circuit 151, which is described more fully above in conjunction with FIG. 3, resulting in the direction signal 172 and in the count signal 176.

The count signal 176 is received by a one-shot circuit 358 that generates a pulse signal 360 having pulses, each pulse having a predetermined pulse width, upon each transition of the count signal 176 having a predetermined direction of transition. For example, in one particular embodiment, the pulses within the pulse signal 360 are generated by the one-shot circuit 358 upon each rising edge of the count signal 176.

An exclusive OR gate 362 is coupled to receive the pulse signal 360 and to receive the direction signal 172 and configured to generate an output signal 364. In operation, the output signal 364 generated by the exclusive OR gate 362, which is a voltage signal, appears similar to the signal 110 of FIG. 2, which is described above to be a current signal.

The voltage signal 364 is converted to a current signal 366b by a switch 372 in combination with a current source 368. The switch 372 has an input node 374, a control node 376, and an output node 380. The current source 368 has an input node 367 coupled to the node 352 and an output node 370 coupled to the input node 374 of the switch 372. A current signal 371 (and 366b) having a positive current value passes from the output node 370 of the current source 368 to the input node 374 of the switch 372 only when the switch 372 is closed, otherwise the current signal 371 (and 366b) has a current value of zero. The switch 372 is coupled to receive the voltage signal 364 at the control node 376, and therefore, the switch 372 is configured to open and close in accordance with states of the signal 364.

In operation, when the direction signal 172 is in a low state indicative of a first direction of rotation, pulses in the pulse signal 360 pass through the exclusive OR gate 362 and appear in the current signals 371, 366a, and 366b. Alternatively, when the direction signal 172 is in a high state indicative of a second different direction of rotation, pulses in the pulse signal 360 are inverted by the exclusive OR gate 362 and appear inverted in the current signals 371, 366a, and 366b. Therefore, the current signals, 366a, 366b are the same as or similar to the signal 110 of FIG. 2.

It will be apparent that the current signal 366a can include an Icc current component as shown, which can result in the current signal 366a being offset from the current signal 366b. The Icc current component can be a current signal corresponding to a DC current used to power other portions of the circuit 350. However, in other embodiments, the current signal 366a can be further offset in a positive or in a negative direction by use of another current source or current sink in parallel with the Icc current signal.

While the circuits shown above in FIGS. 3-6 show particular circuit topologies that can generate the output signals shown in FIG. 2, which are indicative of a speed of rotation and a direction of rotation of a ferromagnetic object capable of rotating, it should be appreciated that other circuits can be used to generate any of the output signals of FIG. 2. For example, any of the voltage signal portions (e.g., the circuit 150 of FIG. 3, but without the current source 196 and the switch 204) of the circuits of FIGS. 3-6 can be replaced with a programmable microprocessor or the like.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A rotation detector, comprising:
a magnetic field sensor for providing an output signal proportional to a magnetic field associated with a ferromagnetic object capable of rotating;
one or more detector circuits coupled to receive the output signal from the magnetic field sensor, each configured to detect a rotation of the ferromagnetic object, the one or more detector circuits configured to generate a respective one or more output signals, each output signal having respective rising and falling edges; and
an output protocol circuit coupled to receive the one or more output signals from the one or more detector circuits and configured to generate an output signal indicative of a speed of rotation of the ferromagnetic object and also indicative of a direction of rotation of the ferromagnetic object, wherein the output signal generated by the output protocol circuit comprises:
instances of a first pulse set when the ferromagnetic object is rotating in a first direction and instances of a second different pulse set when the ferromagnetic object is rotating in a second different direction, wherein each instance of the first pulse set consists of a first quantity of pulses having one or more pulses and each instance of the second pulse set consists of a second different quantity of pulses having one or more pulses.

2. The rotation detector of claim 1, wherein a frequency of occurrence of the instances of the first pulse set or a frequency of occurrence of the instances of the second pulse set are indicative of the speed of rotation of the ferromagnetic object.

3. The rotation detector of claim 1, wherein ones of a pulse within the instances of the first pulse set or a pulse within the instances of the second pulse set have time durations in a range of about five to five hundred milliseconds.

4. The rotation detector of claim 1, wherein a frequency of occurrence of the instances of the first pulse set is about the same as a frequency of occurrence of the instances of the second pulse set when the speed of rotation of the ferromagnetic object is the same when the ferromagnetic object is rotating in the first direction and when the ferromagnetic object is rotating in the second direction.

5. The rotation detector of claim 1, wherein the one or more pulses of the first pulse set each have the same leading edge transition direction, which is the same as the leading edge transition direction of each of the one or more pulses of the second pulse set.

6. The rotation detector of claim 1, wherein the one or more pulses of the first pulse set each have the same leading edge transition direction, which is opposite from the leading edge transition direction of each of the one or more pulses of the second pulse set.

7. The rotation detector of claim 1, wherein the one or more pulses of the first pulse set or the one or more pulses of the second pulse set comprise current pulses.

8. The rotation detector of claim 1, wherein the one or more pulses of the first pulse set or the one or more pulses of the second pulse set comprise voltage pulses.

9. The rotation detector of claim 1, wherein the magnetic field sensor comprises:
a first Hall effect element; and
a second Hall effect element disposed a distance away from the first Hall effect element.

10. The rotation detector of claim 1, wherein the magnetic field sensor comprises at least three magnetic field sensing elements, each magnetic field sensing element spaced apart from an adjacent magnetic field sensing element by a predetermined distance, and wherein a first pair of magnetic field sensing elements selected from among the three magnetic field sensing elements is configured to generate a first differential signal and a second different pair of magnetic field sensing elements selected from among the three magnetic field sensing elements is configured to generate a second differential signal.

11. A method of detecting a rotation of a ferromagnetic object, the method comprising:
generating a first signal proportional to a magnetic field associated with the ferromagnetic object;
detecting a rotation of the ferromagnetic object in response to the first signal;

generating one or more second signals, each having respective rising and falling edges in response to the detecting; and generating a third signal in response to the one or more second signals, the third signal indicative of a speed of rotation of the ferromagnetic object and also indicative of a direction of rotation of the ferromagnetic object, wherein the third signal comprises:

instances of a first pulse set when the ferromagnetic object is rotating in a first direction and instances of a second different pulse set when the ferromagnetic object is rotating in a second different direction, wherein each instance of the first pulse set consists of a first quantity of pulses having one or more pulses and each instance of the second pulse set consists of a second different quantity of pulses having one or more pulses.

12. The method of claim 11, wherein a frequency of occurrence of the instances of the first pulse set or a frequency of occurrence of the instances of the second pulse set are indicative of the speed of rotation of the ferromagnetic object.

13. The method of claim 11, wherein a frequency of occurrence of the instances of the first pulse set is about the same as a frequency of occurrence of the instances of the second pulse set when the speed of rotation of the ferromagnetic object is the same when the ferromagnetic object is rotating in the first direction and when the ferromagnetic object is rotating in the second direction.

14. The method of claim 11, wherein the first quantity of pulses consists of one pulse and the second quantity of pulses comprises a plurality of pulses.

15. The method of claim 11, wherein one or more pulses of the first pulse set each have the same leading edge transition direction, which is the same as the leading edge transition direction of the each of the one or more pulses of the second pulse set.

16. The method of claim 11, wherein the one or more pulses of the first pulse set each have the same leading edge transition direction, which is opposite from the leading edge transition direction of each of the one or more pulses of the second pulse set.

17. The method of claim 11, wherein the one or more pulses of the first pulse set or one or more pulses of the second pulse set comprise current pulses.

18. The method of claim 11, wherein the one or more pulses of the first pulse set or the one or more pulses of the second pulse set comprise voltage pulses.

19. The method of claim 11, wherein at least one Hall effect element is used to generate the first signal.

20. The method of claim 11, wherein at least one magnetic field sensing element is used to generate the first signal.

21. The rotation detector of claim 1, wherein the magnetic field sensor comprises:
a first magnetic field sensing element; and
a second magnetic field sensing element disposed a distance away from the first magnetic field sensing.

22. The method of claim 11, wherein a first Hall effect element and a second Hall effect element are used to generate the first signal, the second Hall effect element disposed a distance away from the first magnetic field sensing element.

23. The method of claim 11, wherein a first magnetic field sensing element and a second magnetic field sensing element are used to generate the first signal, the second magnetic field sensing element disposed a distance away from the first magnetic field sensing element.

* * * * *

UNITED STATES PATENT AND TRADEMARK OFFICE
CERTIFICATE OF CORRECTION

| | | |
|---|---|---|
| PATENT NO. | : 8,994,369 B2 | Page 1 of 1 |
| APPLICATION NO. | : 14/093815 | |
| DATED | : March 31, 2015 | |
| INVENTOR(S) | : Ravi Vig et al. | |

It is certified that error appears in the above-identified patent and that said Letters Patent is hereby corrected as shown below:

In The Specification

Column 1, Line 31, delete "ferromagnetic" and replace with --ferromagnetic object--.

Column 4, Line 51, delete "is some" and replace with --in some--.

Column 5, Line 16, delete "signals 32c" and replace with --signal 32c--.

Column 7, Line 33, delete "86ba-8bb." and replace with --86ba-86bb.--.

Column 8, Line 54, delete "diagram" and replace with --diagrams--.

Column 9, Line 27, delete "Outputs signal" and replace with --Output signals--.

Column 11, Line 21, delete "256, 258a, and 258." and replace with --256, 258a, and 258b.--.

In The Claims

Column 18, Line 23, delete "sensing." and replace with --sensing element.--.

Signed and Sealed this
Eighth Day of March, 2016

Michelle K. Lee
*Director of the United States Patent and Trademark Office*